United States Patent
Wang et al.

(10) Patent No.: US 11,856,726 B2
(45) Date of Patent: Dec. 26, 2023

(54) FIXING ASSEMBLY AND ELECTRONIC DEVICE INCLUDING THE FIXING ASSEMBLY

(71) Applicant: Fulian Precision Electronics (Tianjin) Co., LTD., Tianjin (CN)

(72) Inventors: Wen-Chen Wang, New Taipei (TW); Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 9 days.

(21) Appl. No.: 17/835,884

(22) Filed: Jun. 8, 2022

(65) Prior Publication Data

US 2023/0032930 A1    Feb. 2, 2023

(30) Foreign Application Priority Data

Jul. 30, 2021    (CN) .......................... 202110875173.8

(51) Int. Cl.
*H05K 7/20* (2006.01)
*G06F 1/20* (2006.01)

(52) U.S. Cl.
CPC .......... *H05K 7/20172* (2013.01); *G06F 1/20* (2013.01); *H05K 7/20718* (2013.01)

(58) Field of Classification Search
CPC ............. H05K 7/1487; H05K 7/20172; H05K 7/20727; H05K 5/0221; H05K 7/1489; H05K 7/1411; H05K 7/1418; H05K 7/1457; H05K 7/1488; H05K 7/1492; H05K 7/20718; H05K 7/20754; G06F 1/187; G06F 1/20; G06F 1/183; G06F 1/181; G06F 1/184; G06F 1/189
See application file for complete search history.

(56) References Cited

U.S. PATENT DOCUMENTS

| | | | |
|---|---|---|---|
| 7,009,841 B2 * | 3/2006 | Chen | H05K 7/20172 |
| | | | 415/213.1 |
| 7,400,936 B2 * | 7/2008 | Chang | G11B 33/022 |
| 9,826,658 B1 * | 11/2017 | Mao | G06F 1/183 |
| 9,947,371 B1 * | 4/2018 | Hu | G11B 33/005 |
| 10,061,362 B2 * | 8/2018 | Jau | H05K 7/1487 |
| 10,212,840 B2 * | 2/2019 | Kuan | H05K 7/1487 |
| 10,285,300 B1 * | 5/2019 | Mao | H05K 7/1489 |
| 10,888,025 B2 * | 1/2021 | Wu | H05K 7/1487 |

(Continued)

*Primary Examiner* — Abhishek M Rathod
(74) *Attorney, Agent, or Firm* — ScienBiziP, P.C.

(57) ABSTRACT

A fixing assembly and an electronic device including same are disclosed. The fixing assembly includes a supporting member, a locking member, and a latching member. The supporting member includes a first supporting portion and a second supporting portion connected with each other, and the second supporting portion defines a sliding slot. The locking member includes a locking portion and a connecting portion connected with each other, the connecting portion includes a protrusion and a latching hole. The protrusion is slidably arranged in the sliding slot. When the protrusion slides along the sliding slot, the locking member slides and then rotates relative to the supporting member. The latching member is arranged on the second supporting portion and is adapted to be inserted into the latching hole. When the latching member is inserted into the latching hole, the fan is sandwiched and held between the first supporting portion and the locking portion.

19 Claims, 5 Drawing Sheets

(56) References Cited

U.S. PATENT DOCUMENTS

| | | | |
|---|---|---|---|
| 11,439,033 B2* | 9/2022 | Mao .................... | H05K 7/1457 |
| 2008/0158813 A1* | 7/2008 | Yin .................... | H05K 7/20172 |
| | | | 361/695 |
| 2010/0108847 A1* | 5/2010 | Li ............................ | G06F 1/20 |
| | | | 248/309.1 |
| 2012/0087084 A1* | 4/2012 | Nguyen .................. | G06F 1/187 |
| | | | 361/679.37 |
| 2012/0243178 A1* | 9/2012 | Zhang .................... | G06F 1/187 |
| | | | 361/756 |

* cited by examiner

FIXING ASSEMBLY AND ELECTRONIC DEVICE INCLUDING THE FIXING ASSEMBLY

FIELD

The subject matter herein generally relates to electronic devices, and more particularly to a fixing assembly for a fan and an electronic device including the fixing assembly.

BACKGROUND

Various hardware equipment inside an electronic device may generate a lot of heat during running. In general, heat in the electronic device is dissipated by using a fan. The fan is usually fixed inside the electronic device by using a bracket. For example, as shown in FIG. 1, an electronic device 300 is a server, a bracket 303 is fixedly installed on a bottom wall of a housing 305 of the electronic device 300 and is opposite to a side wall of the housing 305. A fan 301 is manipulated into a space between the bracket 303 and the side wall of the housing 305 from above the housing 305, and then is installed on and locked to the bracket 303 by a fastener 307 such as a screw. The space between the bracket 303 and the side wall is constant, when a fan has a slightly different size, it becomes difficult to install. Moreover, the bracket 303 is arranged on the bottom wall, occupying the layout space of the bottom wall, resulting in interference between the bracket 303 and other structural parts in the server (such as a circuit board 309).

BRIEF DESCRIPTION OF THE DRAWINGS

Implementations of the present disclosure will now be described, by way of embodiments, with reference to the attached figures.

DETAILED DESCRIPTION

Figure 1:
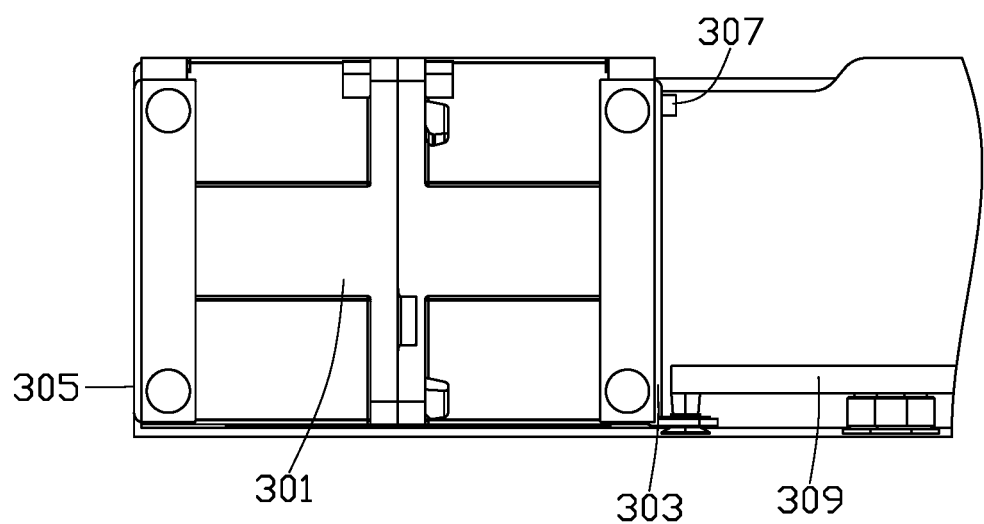
FIG. 1 is a partial schematic diagram of an electronic device according to related art.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

The present disclosure provides a fixing assembly for fixing a fan in place. The fixing assembly includes a supporting member, a locking member, and a latching member. The supporting member comprises a first supporting portion and a second supporting portion arranged on a side of the first supporting portion, and the second supporting portion defines a sliding slot. The locking member includes a locking portion and a connecting portion arranged on a side of the locking portion, the connecting portion includes a protrusion and a latching hole. The protrusion is slidably arranged in the sliding slot. When the protrusion slides along the sliding slot, the locking member slides and then rotates relative to the supporting member. The latching member is arranged on the first supporting portion and is adapted for insertion into the latching hole. When the latching member is inserted into the latching hole, the fan is sandwiched between the first supporting portion and the locking portion.

In the fixing assembly, the locking member is slidable relative to the supporting member, so that a distance between the locking portion and the first supporting portion can be greater than a size of the fan. After the locking member is separated from the fan, the locking member rotates upward relative to the supporting member, so that the fan can be easily manipulated into the installation space from a front side of the locking portion, and the fan can be easily installed on the fixing assembly.

Figure 2:
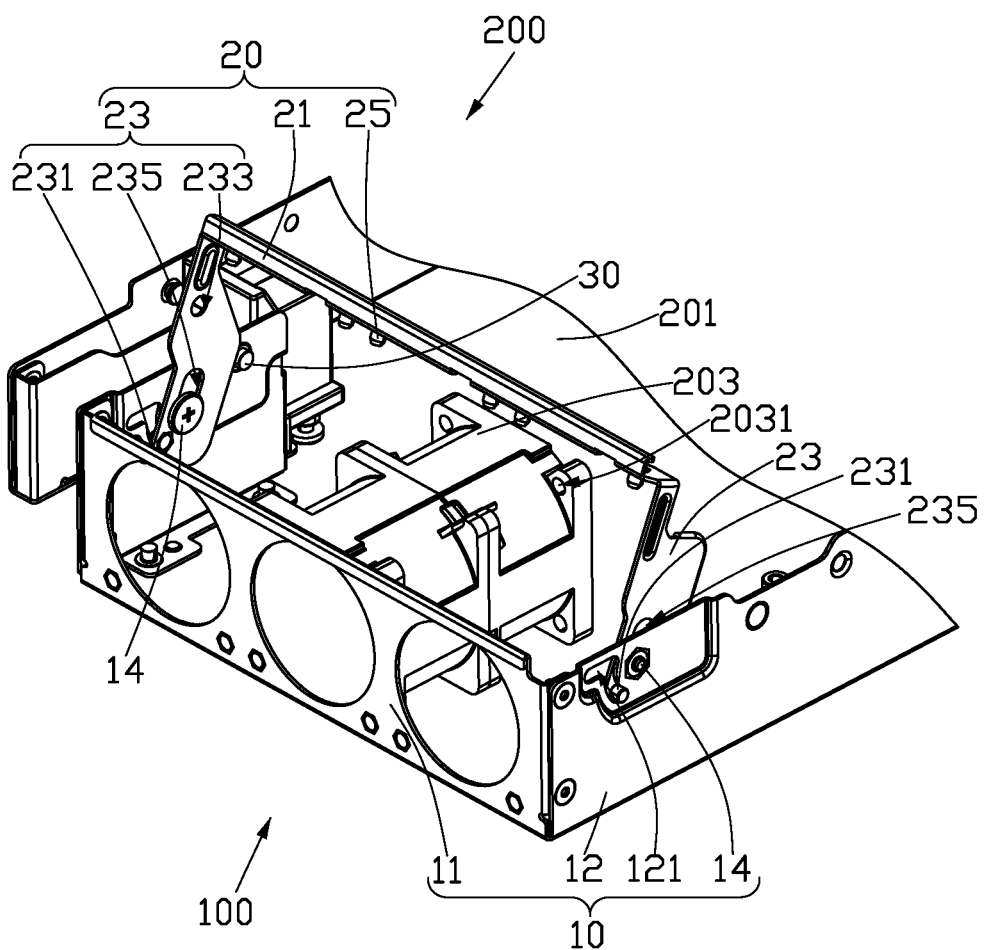
FIG. 2 is a schematic diagram of an electronic device with a fixing assembly according to an embodiment of the present disclosure.
Figure 3:
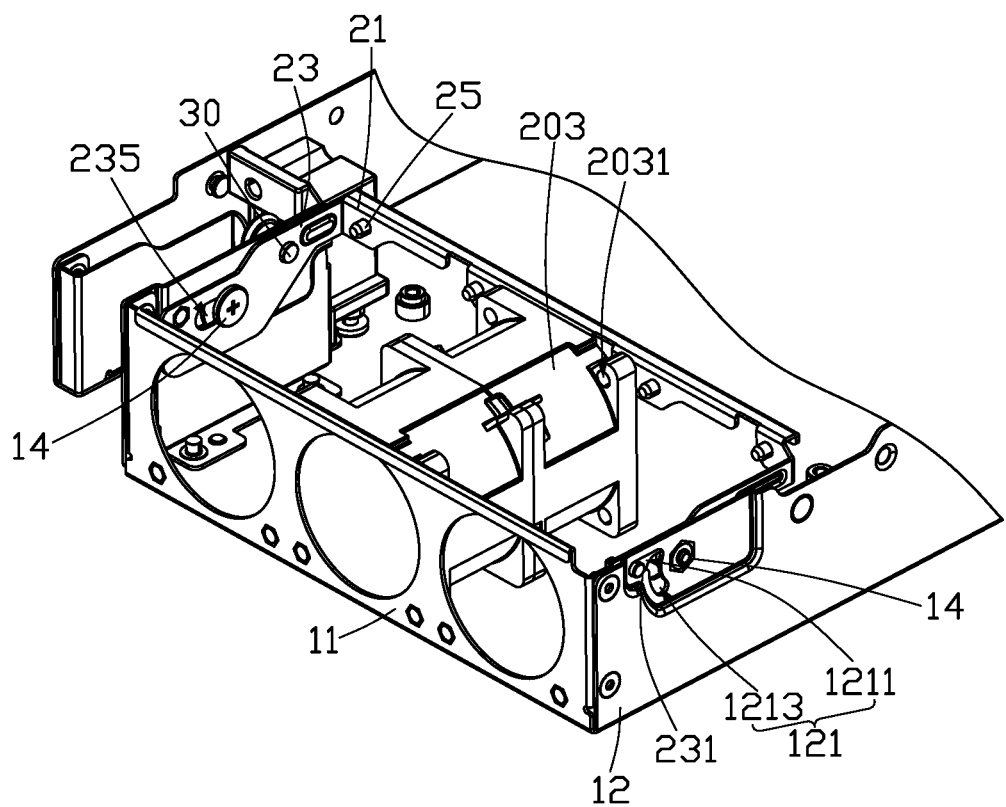
FIG. 3 is a schematic diagram of the electronic device with a fan installed in the fixing assembly according to an embodiment of the present disclosure.

Referring to FIGS. 2 and 3, an embodiment of an electronic device 200 is provided. The electronic device 200 may be, but is not limited to, a chassis of a server. The electronic device 200 includes a housing 201, a fan 203, and a fixing assembly 100. The fixing assembly 100 is configured to attach the fan 203 in the housing 201. The fixing assembly 100 includes a supporting member 10, a locking member 20, and a latching member 30. The supporting member 10 includes a first supporting portion 11 and a second supporting portion 12. The second supporting portion 12 is arranged on a front side of the first supporting portion 11. The second supporting portion 12 defines a sliding slot 121 penetrating the second supporting portion 12. The locking member 20 includes a locking portion 21 and a connecting portion 23. The connecting portion 23 is connected with an end of the locking portion 21 and located on a back side of the locking portion 21. The connecting portion 23 includes a protrusion 231 and a latching hole 233. The protrusion 231 is slidably arranged in the sliding slot 121. When the protrusion 231 slides along the sliding slot 121, the locking member 20 slides and then rotates upward relative to the supporting member 10. The latching member 30 is arranged on the second supporting portion 12 and is adapted for insertion into the latching hole 233. When the latching member 30 is inserted into the latching hole 233, the first supporting portion 11 and the locking portion 21 are in contact with opposite sides of the fan 203, thereby fixing the fan 203 in place. In other words, when the latching member 30 is inserted into the latching hole 233, the fan 203 is sandwiched between the first supporting portion 11 and the locking portion 21.

During installation, the protrusion 231 slides in the sliding slot 121 along a direction from the first supporting portion 11 to the locking portion 21, causing the locking member 20 to move relative to the supporting member 10. The protrusion 231 continues to slide in the sliding slot 121 to cause the locking member 20 to rotate upward, so that the fan 203 can be manipulated into an installation space from a front side of the locking portion 21. The protrusion 231 slides along the sliding slot 121 to cause the locking member 20 to rotate downward until the locking portion 21 and the first supporting portion 11 are located on opposite sides of the fan 203. The protrusion 231 continues to slide along the sliding slot 121 to move the locking portion 21 towards the first supporting portion 11 until the locking portion 21 and the first supporting portion 11 make contact with the fan 203, the latching member 30 is inserted into the latching hole 233, and the locking member 20 is fixed relative to the supporting member 10, so that the fan 203 is clamped between and fixed by the locking portion 21 and the first supporting portion 11.

For removal of the fan 203, the latching member 30 is removed outside the latching hole 233, the protrusion 231 slides along the sliding slot 121 to move the locking portion 21 away from the first supporting portion 11 to cause the locking portion 21 and the first supporting portion 11 to separate from the fan 203. The protrusion 231 continues to slide in the sliding slot 121, causing the locking member 20 to rotate upward relative to the supporting member 10, so that the fan 203 in the installation space can be removed from the front side of the locking portion 21.

In the fixing assembly 100, the locking member 20 is slidable relative to the supporting member 10, so that a distance between the locking portion 21 and the first supporting portion 11 can be greater than a size of the fan 203. After the locking member 20 is separated from the fan 203, the locking member 20 rotates upward relative to the supporting member 10, so that the fan 203 can be easily manipulated into the installation space from the front side of the locking portion 21, and the fan 203 can be easily installed on the fixing assembly 100.

Since the locking member 20 can rotate relative to the supporting member 10, the locking portion 21 can rotate upward toward a back side of the second supporting portion 12, leaving an unoccupied space on a front side of the second supporting portion 12, which facilitates an easy layout in the housing 201 of the electronic device 200.

In some embodiments, the electronic device 200 may include, but is not limited to, servers, communication equipment, audio equipment, medical equipment, etc.

In one embodiment, the first supporting portion 11 and the second supporting portion 12 are parts of the housing 201. In other possible embodiments, the first supporting portion 11 and the second supporting portion 12 may also be structures arranged on the housing 201.

Figure 4:
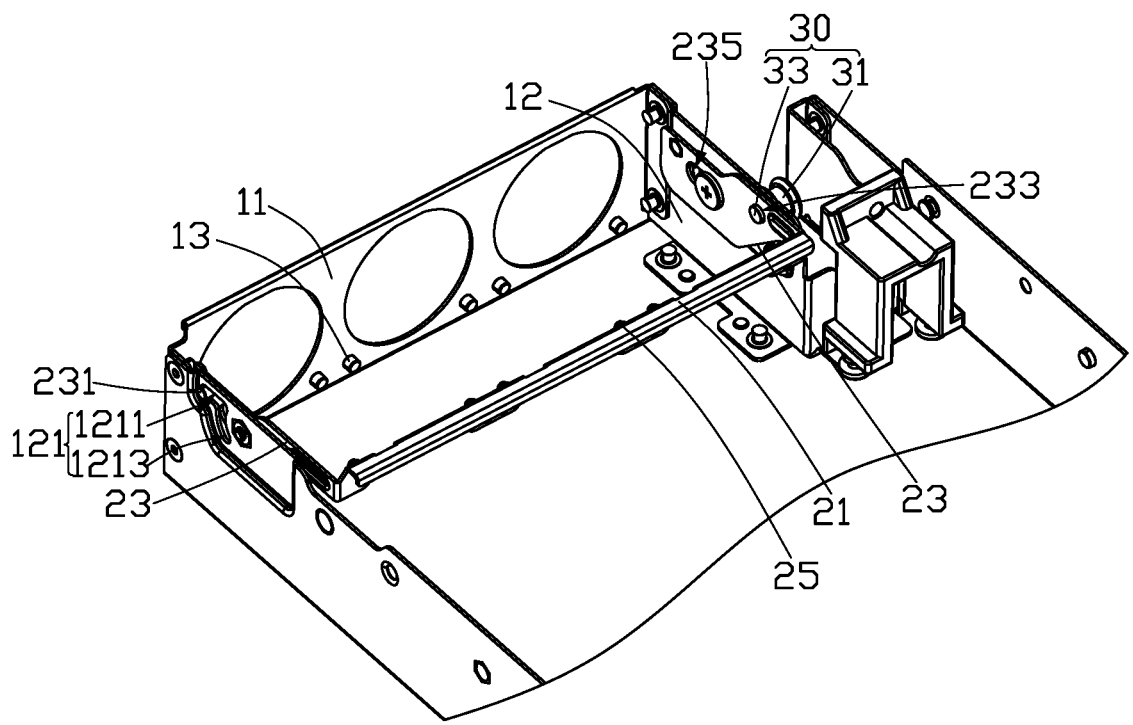
FIG. 4 is a schematic diagram of the fixing assembly without a fan in the electronic device according to an embodiment of the present disclosure.
Figure 5:
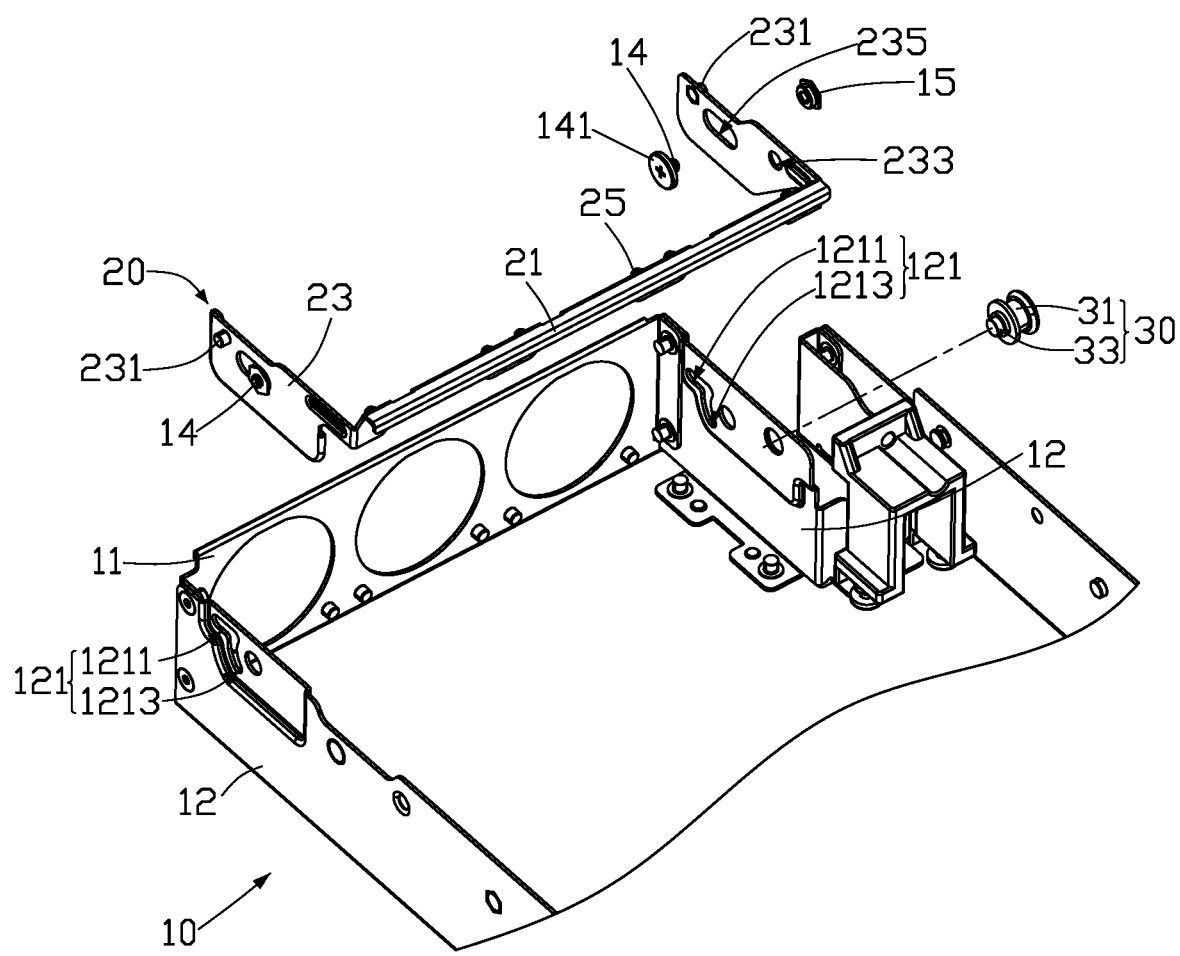
FIG. 5 is an exploded view of the fixing assembly in the electronic device according to an embodiment of the present disclosure.

Referring to FIGS. 4 and 5, in one embodiment, the supporting member 10 further includes a first fixing portion 13. The first fixing portion 13 is arranged on the front side of the first supporting portion 11. The locking member 20 further includes a second fixing portion 25. The second fixing portion 25 is arranged on the back side of the locking portion 21. The first fixing portion 13 and the second fixing portion 25 are inserted into two mounting holes 2031 on opposite sides of the fan 203, so that the fan 203 is clamped between and fixed by the locking portion 21 and the first supporting portion 11.

In other embodiments, the locking portion 21 and the first supporting portion 11 resist opposite sides of the fan 203, to cause the fan 203 to be stably clamped between the supporting member 10 and the locking member 20.

In one embodiment, there are two connecting portions 23 and two second supporting portions 12. The two connecting portions 23 are connected with opposite ends of the locking portion 21 and located on the back side of the locking portion 21. The two second supporting portions 12 are connected with opposite ends of the first supporting portion 11 and located on the front side of the first supporting portion 11. The protrusion 231 on each of the connecting portions 23 slides along one sliding slot 121 of the two second supporting portions 12 to cause the locking member 20 to slide and rotate smoothly relative to the supporting member 10.

The sliding slot 121 includes a first slot portion 1211 and a second slot portion 1213 intercommunicating with each other. The first slot portion 1211 is closer than the second slot portion 1213 to the first supporting portion 11. The first slot portion 1211 extends along a straight line. In one embodiment, the first slot portion 1211 extends in the direction from the first supporting portion 11 to the locking portion 21. The protrusion 231 slides along the first slot portion 1211 to cause the locking portion 21 to move relative to the first supporting portion 11 to increase or reduce the distance between the locking portion 21 and the first supporting portion 11. The second slot portion 1213 extends along a curve. The protrusion 231 slides along the second slot portion 1213 to cause the locking portion 21 to rotate relative to the first supporting portion 11.

The supporting member 10 further includes a rotating shaft 14. The rotating shaft 14 is arranged on the second supporting portion 12. Without being a limitation, the second slot portion 1213 may extend along a circular arc. A center of the circular arc is located on an axis of the rotating shaft 14. The connecting portion 23 defines a through hole 235, and the rotating shaft 14 can be inserted into the through hole 235. When the protrusion 231 slides to the second slot portion 1213 from the first slot portion 1211, the rotating shaft 14 is coaxial with the through hole 235, and the locking member 20 rotates around the rotating shaft 14. The path of movement and rotation of the locking member 20 relative to the supporting member 10 is fixed, so that the operation of the locking member 20 is simple. Installation of the fan 203 is easy, and collision between the locking member 20 and other structures in the electronic device 200 cannot occur because the movement of the locking member 20 is along a fixed trajectory.

In one embodiment, the rotating shaft 14 may be, but is not limited to, slidably arranged in the through hole 235. A sliding direction of the rotating shaft 14 in the through hole 235 is opposite to a sliding direction of the protrusion 231 in the first slot portion 1211. When the protrusion 231 slides to the second slot portion 1213 from the first slot portion 1211, the rotating shaft 14 is located at one end of the through hole 235, so that when the protrusion 231 slides along the second slot portion 1213, the locking member 20 rotates around the rotating shaft 14.

In one embodiment, an end of the rotating shaft 14 is provided with a stopping portion 141. The stopping portion 141 is located on a side of the connecting portion 23 facing away from the second supporting portion 12, so that the locking member 20 does not disengage from the supporting member 10 when moving relative to the supporting member 10. Specifically, an end of the rotating shaft 14 away from the stopping portion 141 is provided with screw threads and is threaded with a fastener 15. The fastener 15 is located on a side of the second supporting portion 12 away from the connecting portion 23. The second supporting portion 12 and the connecting portion 23 are stopped by the fastener 15 and the stopping portion 141 respectively, so that the rotating shaft 14 is fixed relative to the second supporting portion 12.

In other embodiments, the rotating shaft 14 may also be directly threaded to the second supporting portion 12, and the fastener 15 can be omitted.

In other embodiments, the stopping portion 141 may be omitted, thus when the distance between the adjacent connecting portion 23 and the second supporting portion 12 is less than a preset value and the protrusion 231 is located in the sliding slot 121, the locking member 20 will still not be separated from the supporting member 10.

In one embodiment, the latching member 30 includes a main body 31 and a latching shaft 33. The main body 31 is arranged on the second supporting portion 12. The latching shaft 33 is retractably arranged on the main body 31 and is adapted to be inserted into or disengaged from the latching hole 233. When the latching shaft 33 extends into the latching hole 233 to fix the locking member 20 to the supporting member 10, the fan 203 is locked to the fixing assembly 100. When the latching shaft 33 is separated from the latching hole 233, the locking member 20 can move relative to the supporting member 10, and the fan 203 is unlocked from the fixing assembly 100.

In one embodiment, when the locking member 20 rotates to a preset position relative to the supporting member 10, the latching shaft 33 extends and resists against the locking member 20 to keep the locking member 20 in the preset position. The preset position may be, but is not limited to, the position of the locking member 20 when the protrusion 231 slides to one end of the second slot portion 1213 away from the first slot portion 1211. For example, in other embodiments, the latching shaft 33 may also extend and resist against the locking member 20 when the protrusion 231 slides to the middle position of the second slot portion 1213.

In one embodiment, and without limitation, the latching shaft 33 may extend and resist against a side of the locking member 20 facing a bottom wall of the housing 201. For example, in other embodiments, the locking member 20 may further define another latching hole 233. When the locking member 20 rotates to the preset position relative to the supporting member 10, the latching shaft 33 extends into the other latching hole 233 to maintain the position of the locking member 20 relative to the supporting member 10.

When installing, the locking portion 21 is pulled to move away from the first supporting portion 11, and the latching shaft 33 of the latching member 30 is pressed back by the connecting portion 23 and separated from the latching hole 233. The protrusion 231 moves along the first slot portion 1211 towards the second slot portion 1213, the rotating shaft 14 moves along the through hole 235 towards the first supporting portion 11 to an end of the through hole 235, and the protrusion 231 slides to the second slot portion 1213. The protrusion 231 slides along the second slot portion 1213, and the locking member 20 rotates upward around the rotating shaft 14 until the protrusion 231 slides to the end of the second slot portion 1213 away from the first slot portion 1211. The latching shaft 33 extends and resists against the side of the connecting portion 23 facing the bottom wall of the housing 201, so the position of the locking member 20 relative to the supporting member 10 remains unchanged. The fan 203 is then manipulated into the installation space from the front side of the locking portion 21, and the first fixing portion 13 is inserted into the mounting hole 2031 on one side of the fan 203. The locking portion 21 is pressed down to cause the locking member 20 to rotate downward, and the latching shaft 33 is pressed back by the connecting portion 23. The protrusion 231 slides along the second slot portion 1213 towards the first slot portion 1211, the locking member 20 rotates downward until the protrusion 231 slides to the first slot portion 1211, and the locking portion 21 and the first supporting portion 11 are located on the opposite sides of the fan 203. The protrusion 231 moves towards the first supporting portion 11 along the first slot portion 1211, and the rotating shaft 14 moves towards the locking portion 21 along the through hole 235 until the protrusion 231 moves to the end of the first slot portion 1211 away from the second slot portion 1213. The latching shaft 33 extends into the latching hole 233, and the second fixing portion 25 extends into the mounting hole 2031 on the other side of the fan 203, so that the fan 203 is fixed by the supporting member 10 and the locking member 20.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A fixing assembly for fixing a fan in place, the fixing assembly comprising:
   a supporting member comprising a first supporting portion and a second supporting portion arranged on a side of the first supporting portion, the second supporting portion defining a sliding slot;
   a locking member comprising a locking portion and a connecting portion arranged on a side of the locking portion, the connecting portion comprising a protrusion slidably arranged in the sliding slot and a latching hole, wherein when the protrusion slides along the sliding slot, the locking member slides and then rotates relative to the supporting member; and
   a latching member arranged on the second supporting portion, wherein the latching member is adapted to be inserted into the latching hole, when the latching member is inserted into the latching hole, the fan is sandwiched between the first supporting portion and the locking portion.

2. The fixing assembly of claim 1, wherein the sliding slot comprises a first slot portion and a second slot portion intercommunicating with each other, the first slot portion is closer than the second slot portion to the first supporting portion, the first slot portion extends along a straight line, and the second slot portion extends along a curve.

3. The fixing assembly of claim 2, wherein the supporting member further comprises a rotating shaft arranged on the second supporting portion, the second slot portion extends along a circular arc, a center of the circular arc is located on an axis of the rotating shaft; the connecting portion defines a through hole, the rotating shaft is adapted to be inserted into the through hole; when the protrusion slides to the second slot portion from the first slot portion, the rotating shaft is coaxial with the through hole.

4. The fixing assembly of claim 3, wherein the rotating shaft is slidably arranged in the through hole, a sliding direction of the rotating shaft in the through hole is opposite to a sliding direction of the protrusion in the first slot portion; when the protrusion slides to the second slot portion from the first slot portion, the rotating shaft is located at an end of the through hole.

5. The fixing assembly of claim 3, further comprising a stopping portion arranged on an end of the rotating shaft, wherein the stopping portion is located on a side of the connecting portion facing away from the second supporting portion.

6. The fixing assembly of claim 5, further comprising a fastener arranged on an end of the rotating shaft facing away from the stopping portion, wherein the second supporting portion and the connecting portion are stopped by the fastener and the stopping portion respectively.

7. The fixing assembly of claim 1, wherein the latching member comprises a main body and a latching shaft, the main body is arranged on the second supporting portion, the latching shaft is retractably arranged on the main body and is adapted to be inserted into or disengaged from the latching hole.

8. The fixing assembly of claim 1, wherein the supporting member further comprises a first fixing portion arranged on the first supporting portion, the locking member further comprises a second fixing portion arranged on the locking portion, the first fixing portion and the second fixing portion are adapted to be inserted into two mounting holes on opposite sides of the fan.

9. The fixing assembly of claim 1, wherein the supporting member comprises two second supporting portions arranged on opposite ends of the first supporting portion, the locking member comprises two connecting portions arranged on opposite ends of the locking portion.

10. An electronic device comprising:
   a housing;
   a fan; and
   a fixing assembly for fixing the fan in the housing, the fixing assembly comprising:
      a supporting member comprising a first supporting portion and a second supporting portion arranged on a side of the first supporting portion, the second supporting portion defining a sliding slot;
      a locking member comprising a locking portion and a connecting portion arranged on a side of the locking portion, the connecting portion comprising a protrusion slidably arranged in the sliding slot and a latching hole, wherein when the protrusion slides along the sliding slot, the locking member slides and then rotates relative to the supporting member; and
      a latching member arranged on the second supporting portion, wherein the latching member is adapted to be inserted into the latching hole, when the latching member is inserted into the latching hole, the fan is sandwiched between the first supporting portion and the locking portion.

11. The electronic device of claim 10, wherein the sliding slot comprises a first slot portion and a second slot portion intercommunicating with each other, the first slot portion is closer than the second slot portion to the first supporting portion, the first slot portion extends along a straight line, and the second slot portion extends along a curve.

12. The electronic device of claim 11, wherein the supporting member further comprises a rotating shaft arranged on the second supporting portion, the second slot portion extends along a circular arc, a center of the circular arc is located on an axis of the rotating shaft; the connecting portion defines a through hole, the rotating shaft is adapted to be inserted into the through hole; when the protrusion slides to the second slot portion from the first slot portion, the rotating shaft is coaxial with the through hole.

13. The electronic device of claim 12, wherein the rotating shaft is slidably arranged in the through hole, a sliding direction of the rotating shaft in the through hole is opposite to a sliding direction of the protrusion in the first slot portion; when the protrusion slides to the second slot portion from the first slot portion, the rotating shaft is located at an end of the through hole.

14. The electronic device of claim 12, wherein the fixing assembly further comprises a stopping portion arranged on an end of the rotating shaft, the stopping portion is located on a side of the connecting portion facing away from the second supporting portion.

15. The electronic device of claim 14, wherein the fixing assembly further comprises a fastener arranged on an end of the rotating shaft facing away from the stopping portion, the second supporting portion and the connecting portion are stopped by the fastener and the stopping portion respectively.

16. The electronic device of claim 10, wherein the latching member comprises a main body and a latching shaft, the main body is arranged on the second supporting portion, the latching shaft is retractably arranged on the main body and is adapted to be inserted into or disengaged from the latching hole.

17. The electronic device of claim 10, wherein the supporting member further comprises a first fixing portion arranged on the first supporting portion, the locking member further comprises a second fixing portion arranged on the locking portion, the first fixing portion and the second fixing portion are adapted to be inserted into two mounting holes on opposite sides of the fan.

18. The electronic device of claim 10, wherein the supporting member comprises two second supporting portions arranged on opposite ends of the first supporting portion, the locking member comprises two connecting portions arranged on opposite ends of the locking portion.

19. The electronic device of claim 10, wherein the first supporting portion and the second supporting portion are parts of the housing.

* * * * *